(12) United States Patent
Lee et al.

(10) Patent No.: US 11,895,771 B2
(45) Date of Patent: Feb. 6, 2024

(54) PRINTED CIRCUIT BOARD

(71) Applicant: SAMSUNG ELECTRO-MECHANICS CO., LTD., Suwon-si (KR)

(72) Inventors: Jin Uk Lee, Suwon-si (KR); Young Ook Cho, Suwon-si (KR); Eun Sun Kim, Suwon-si (KR); Young Hun You, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/189,756

(22) Filed: Mar. 2, 2021

(65) Prior Publication Data

US 2022/0167502 A1  May 26, 2022

(30) Foreign Application Priority Data

Nov. 23, 2020  (KR) .......................... 10-2020-0157764

(51) Int. Cl.
*H05K 1/11* (2006.01)

(52) U.S. Cl.
CPC ....... *H05K 1/113* (2013.01); *H05K 2201/096* (2013.01)

(58) Field of Classification Search
CPC ..... H05K 1/113; H05K 1/11; H05K 2201/096
USPC ........................................... 174/261
See application file for complete search history.

(56) References Cited

U.S. PATENT DOCUMENTS

| 2006/0137904 A1 | 6/2006 | Hirata | |
|---|---|---|---|
| 2017/0178810 A1* | 6/2017 | Berdy | ...................... H01G 4/38 |
| 2019/0074195 A1* | 3/2019 | Hu | ........................ H01L 21/561 |

FOREIGN PATENT DOCUMENTS

| JP | 4319976 B2 | 6/2009 |
|---|---|---|
| JP | 2018-113679 A | 7/2018 |
| KR | 10-2013-0039237 A | 4/2013 |

* cited by examiner

*Primary Examiner* — Tremesha S Willis
(74) *Attorney, Agent, or Firm* — MORGAN, LEWIS & BOCKIUS LLP

(57) ABSTRACT

A printed circuit board includes: a first insulating layer; a via pad including a first layer embedded in the first insulating layer and a second layer disposed on the first layer; and a first via layer disposed on the via pad, wherein the second layer has a width decreasing in a direction away from the first layer in a stacking direction of the first and second layers.

20 Claims, 8 Drawing Sheets

PRINTED CIRCUIT BOARD

CROSS-REFERENCE TO RELATED APPLICATION(S)

This application claims the benefit of priority to Korean Patent Application No. 10-2020-0157764, filed on Nov. 23, 2020 in the Korean Intellectual Property Office, the entire disclosure of which is incorporated herein by reference.

TECHNICAL FIELD

The present disclosure relates to a printed circuit board.

BACKGROUND

Concerning circuit patterns, there has recently been increasing demand for fine circuit patterns having a line/space (L/S) ratio of 5/5 or less, and accordingly, investment in new equipment or a change in circuit pattern formation method is required. Here, it is necessary to develop a process for implementing a fine circuit without increasing costs as compared with a conventional circuit pattern formation process. When a dry film resist (DFR) is thick, which causes a decrease in resolution, it is difficult to stably implement L/S=5/5 or less. It is thus required to secure an external solder connection pad or a via pad to have a predetermined thickness or more while implementing the fine circuit.

SUMMARY

An aspect of the present disclosure may provide a printed circuit board in which a fine circuit can be implemented.

Another aspect of the present disclosure may provide a printed circuit board in which no defect occurs in a via pad or an external solder connection pad at the time of processing a via or bonding a solder.

According to an aspect of the present disclosure, a printed circuit board may include: a first insulating layer; a via pad including a first layer embedded in the first insulating layer and a second layer disposed on the first layer; and a first via layer disposed on the via pad, wherein the second layer has a width decreasing in a direction away from the first layer in a stacking direction.

According to another aspect of the present disclosure, a printed circuit board may include: a first insulating layer; a via pad and a microcircuit unit at least partially embedded in the first insulating layer; and a first via layer penetrating through at least a portion of the first insulating layer and disposed on the via pad, wherein the via pad has a step portion.

According to another aspect of the present disclosure, a printed circuit board may include: a first insulating layer having a first surface and a second surface opposing each other in a stacking direction; a via pad at least partially embedded in the first insulating layer; a fine circuit unit embedded in the first insulating layer, exposed to the first surface of the first insulating layer, and disposed adjacent to a side of the via pad in a width direction perpendicular to the stacking direction; and a first via layer embedded in the first insulating layer, exposed to the second surface of the first insulating layer, and connected to the via pad, wherein a thickness of the via pad is larger than a thickness of the fine circuit unit.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

In the present disclosure, the expression "side portion", "side surface", or the like is used to refer to a left or right direction or a surface in that direction based on the drawings for convenience, the expression "upper side", "upper portion", "upper surface", or the like is used to refer to an upward direction or a surface in that direction based on the drawings for convenience, and the expression "lower side", "lower portion", "lower surface", or the like is used to refer to a downward direction or a surface in that direction based on the drawings for convenience. In addition, the expression "positioned on the side portion, the upper side, the upper portion, the lower side, or the lower portion" conceptually includes a case in which a target component is positioned in a corresponding direction but is not in direct contact with a reference component, as well as a case in which the target component is in direct contact with the reference component in the corresponding direction. However, these directions are defined for convenience of explanation, and the claims are not particularly limited by the directions defined above, and the concepts of the upper and lower portions, sides and surfaces may be changed.

Figure 1:
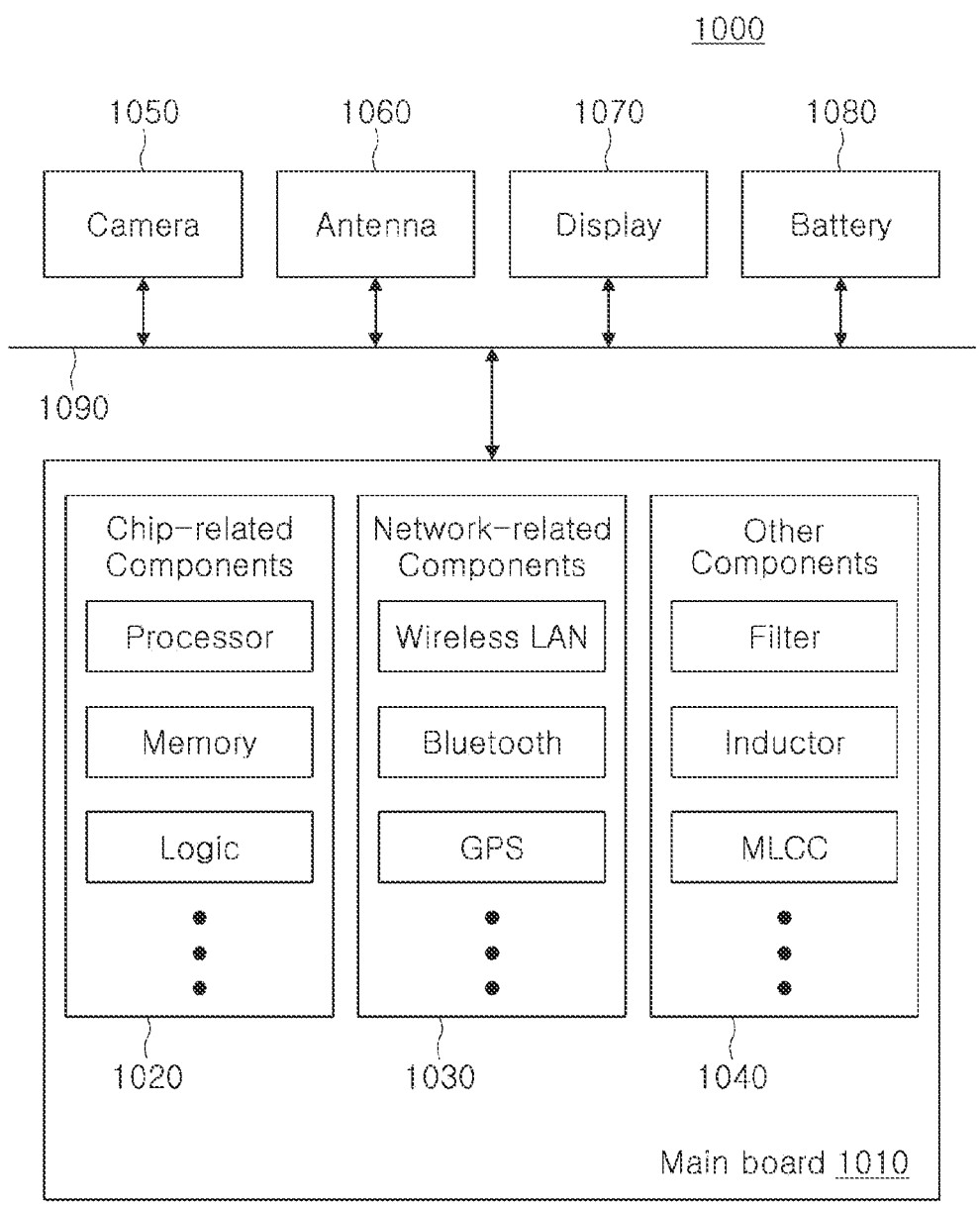
FIG. 1 is a block diagram schematically illustrating an example of an electronic device system.

FIG. 1 is a block diagram schematically illustrating an example of an electronic device system.

Referring to FIG. 1, an electronic device 1000 may accommodate a main board 1010 therein. Chip-related components 1020, network-related components 1030, and other components 1040 may be physically and/or electrically connected to the main board 1010. These components may also be coupled to other electronic components, which will be described later, to form various signal lines 1090.

The chip-related components 1020 may include: a memory chip such as a volatile memory (e.g. a dynamic random access memory (DRAM)), a non-volatile memory (e.g. a read only memory (ROM)), or a flash memory; an application processor chip such as a central processor (e.g. a central processing unit (CPU)), a graphics processor (e.g. a graphics processing unit (GPU)), a digital signal processor, a cryptography processor, a microprocessor, or a microcontroller; and a logic chip such as an analog-to-digital converter or an application-specific integrated circuit (ASIC). However, the chip-related components 1020 are not limited thereto, and may include any other types of chip-related components. Also, these chip-related components may also be combined with each other. The chip-related component may be in the form of a package including the above-described chip.

The network-related components 1030 may include wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+ (HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G, and any other wireless and wired protocols designated thereafter. However, the network-related components 1030 are not limited thereto, and may include any other wireless or wired standards or protocols. Also, the network-related component 1030 may be provided in the form of a package in combination with the chip-related component 1020.

The other components 1040 may include a high-frequency inductor, a ferrite inductor, a power inductor, ferrite beads, low-temperature co-firing ceramics (LTCC), an electro-magnetic interference (EMI) filter, a multi-layer ceramic condenser (MLCC), and the like. However, the other components 1040 are not limited thereto, and may include passive elements in the form of chip components used for various other purposes. Also, the other component 1040 may be provided in the form of a package in combination with the chip-related component 1020 and/or the network-related component 1030.

The electronic device 1000 may include any other electronic components that may be or may not be physically and/or electrically connected to the main board 1010 according to the type of electronic device 1000. Examples of the other electronic components may include a camera 1050, an antenna 1060, a display 1070, and a battery 1080. However, the other electronic components are not limited thereto, and may be an audio codec, a video codec, a power amplifier, a compass, an accelerometer, a gyroscope, a speaker, a mass storage device (e.g. a hard disk drive), a compact disc (CD), and a digital versatile disc (DVD). Also, the electronic device 1000 may include any other electronic components used for various purposes according to the type of electronic device 1000.

The electronic device 1000 may be a smartphone, a personal digital assistant, a digital video camera, a digital still camera, a network system, a computer, a monitor, a tablet, a laptop, a netbook, a television, a video game machine, a smart watch, or an automotive component. However, the electronic device 1000 is not limited thereto, and may be any other electronic device processing data.

Figure 2:
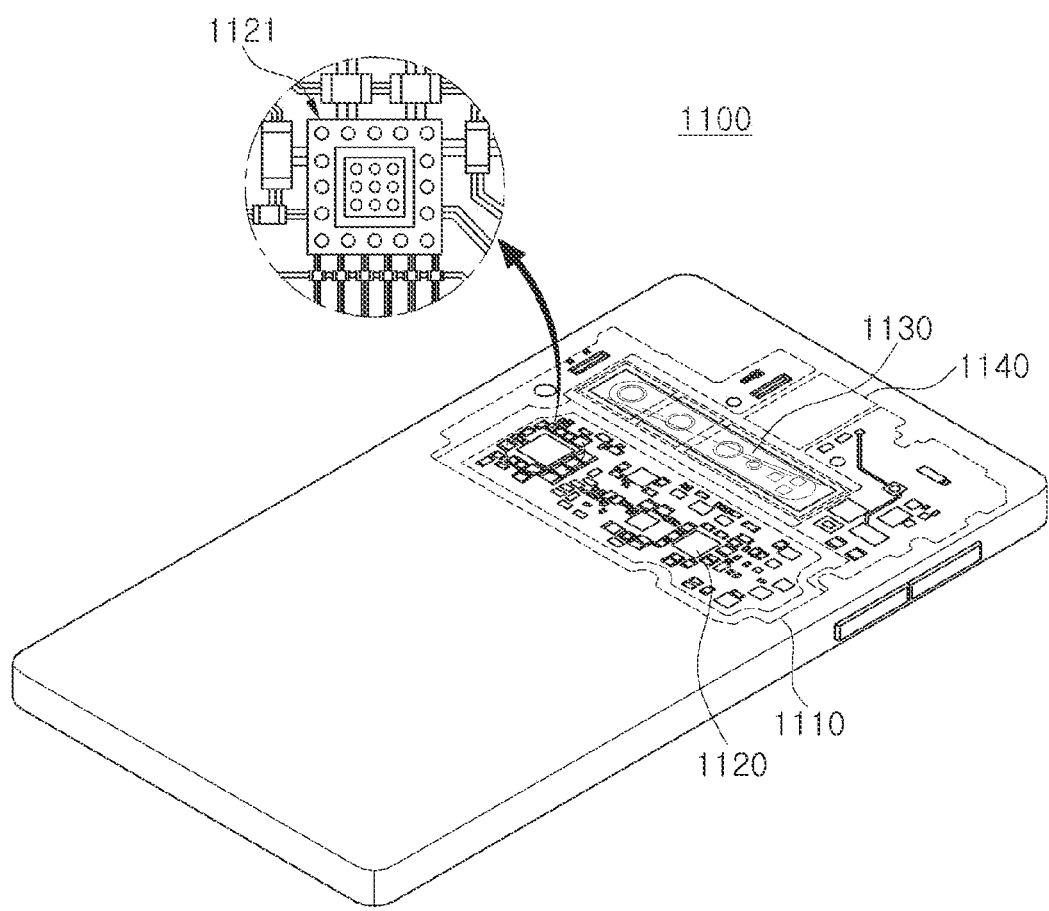
FIG. 2 is a perspective view schematically illustrating an example of an electronic device.

FIG. 2 is a perspective view schematically illustrating an example of an electronic device.

Referring to FIG. 2, the electronic device may be, for example, a smartphone 1100. A mother board 1110 may be accommodated in the smartphone 1100, and various electronic components 1120 may be physically and/or electrically connected to the motherboard 1110. Also, a camera 1130 and/or a speaker 1140 and the like may be accommodated in the smartphone 1100. Some of the electronic components 1120 may be the above-described chip-related components, for example, printed circuit boards 1121, but are not limited thereto. The printed circuit board 1121 may be in a type in which an electronic component is embedded in a multilayer printed circuit board, but is not limited thereto. Meanwhile, the electronic device is not necessarily limited to the smartphone 1100, and may be another electronic device as described above.

Figure 3:
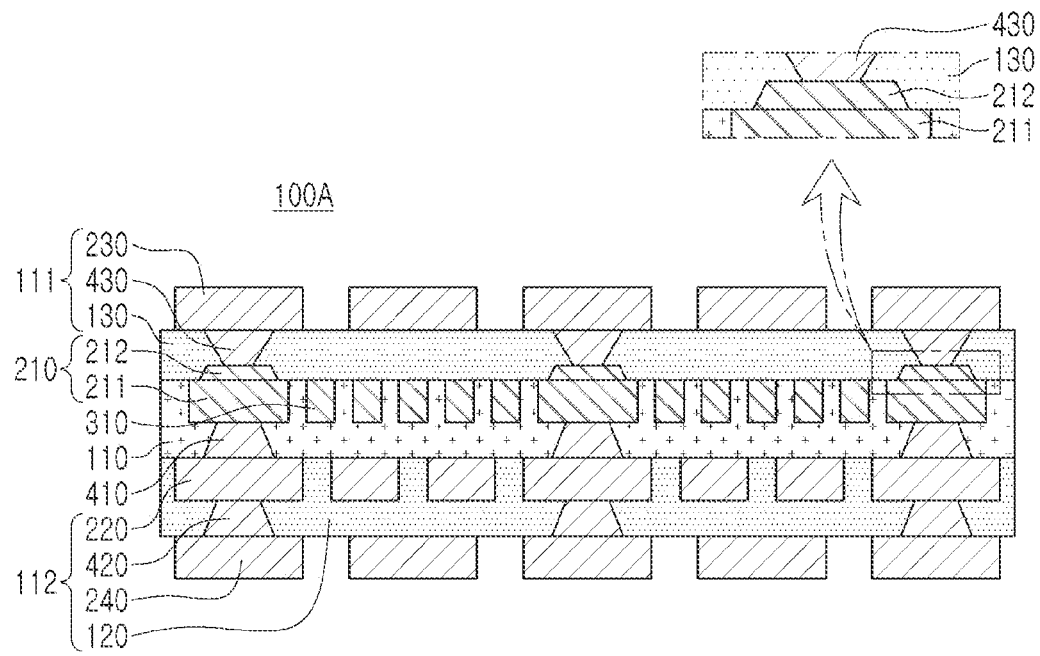
FIG. 3 is a cross-sectional view schematically illustrating a structure of a printed circuit board according to a first exemplary embodiment in the present disclosure.

FIG. 3 is a cross-sectional view schematically illustrating a structure of a printed circuit board according to a first exemplary embodiment in the present disclosure.

Referring to FIG. 3, the printed circuit board 100A according to the first exemplary embodiment, a first insulating layer 110, a via pad 210 disposed in the first insulating layer 110 and including a first layer 211 and a second layer 212 disposed on the first layer 211, a fine circuit unit 310 embedded in the first insulating layer 110, a first via layer 410 penetrating through at least a portion of the first insulating layer 110 and contacting the via pad 210, and build-up structures 111 and 112 disposed on a first surface and a second surface of the first insulating layer 110, respectively, and including a plurality of insulating layers (e.g., first and second insulating layers 120 and 130), a plurality of wiring layers 220, 230, and 240, and a plurality of via layers 420 and 430. Hereinafter, a stacking direction or a thickness direction may refer to a direction in which the insulating layers 110, 120 and 130 or the wiring layers 220, 230 and 240 are stacked.

For example, the printed circuit board 100A according to the first exemplary embodiment may be manufactured using a detach carrier film (DCF) as in a process to be described later. Accordingly, at least a portion of the via pad 210 may be embedded in an upper portion of the first insulating layer 110, and an area of the via pad 210 embedded in the first insulating layer 110 may be the first layer 211. In addition, the second layer 212 may be disposed on the first layer 211. As a result, the via pad 210 including the first layer 211 and the second layer 212 may be thicker than the fine circuit unit 310 embedded together in the first insulating layer 110. Consequently, the via pad 210 can not only be formed simultaneously with the formation of the fine circuit unit 310 and but also prevented from defects such as destruction or penetration occurring at the time of processing a via. In addition, unlike the first layer 211 embedded in the first insulating layer 110, the second layer 212 of the via pad 210 may protrude from the first insulating layer 110. Accordingly, the second layer 212 may protrude from the first surface of the first insulating layer 110 and be covered by the third insulating layer 130 of the build-up structure 111 to be disposed thereafter. In addition, unlike the first layer 211 having a substantially constant width or cross-sectional area, the second layer 212 may have a varying width. Specifically, the second layer 212 may have a width decreasing in a direction away from the first layer 211. Hereinafter, a "width" of an element in the printed circuit board 100A may refer to a lateral dimension of the element measured in a direction (a width direction) perpendicular to the stacking direction.

Meanwhile, the printed circuit board 100A according to the first exemplary embodiment may include the fine circuit unit 310 embedded in the first insulating layer 110. In order to implement fine circuit patterns, a dry film resist (DFR) used for patterning needs to be thin. When the dry film resist is thin, however, the via pad disposed on the same layer is also thin, and a defect may occur in the via pad at the time of processing the via. In the printed circuit board 100A according to the first exemplary embodiment, such a defect can be prevented by forming the via pad 210 thickly in a plurality of layers, and thus, the fine circuit unit 310 can be implemented using the thin dry film resist. In addition, the fine circuit unit may have a line/space (L/S) ratio of 5/5 (um) or less or thereabout. For example, the L/S ratio may be 5/5, but may be 4/6, 6/4, or a median value thereof. Therefore, in the fine circuit unit 310 according to the present disclosure, a pitch between fine circuit patterns may be 10 μm or less. The definitions of the L/S ratio and the pitch, and the L/S ratio able to be implemented through the present disclosure will be described in more detail later.

Hereinafter, each component of the printed circuit board 100A according to the present disclosure will be described in more detail.

As a material of the first to third insulating layers 110 to 130, an insulating material may be used. The insulating material may be a thermosetting resin such as an epoxy resin or a thermoplastic resin such as polyimide. Also, the insulating material may be a thermosetting resin or a thermoplastic resin mixed with an inorganic filler such as silica and a reinforcing material such as glass fiber, e.g. prepreg, but is not limited thereto. For example, an Ajinomoto build-up film (ABF) may be used. The ABF may be provided as a resin coated copper (RCC) type, but is not limited thereto. If necessary, a photosensitive material such as a photo imageable dielectric (PID) may be used.

The via pad 210 may include the first layer 211 and the second layer 212 disposed on the first layer 211. As a material of the first layer 211 and the second layer 212, a metal material may be used. Here, the metal material may be copper (Cu), aluminum (Al), silver (Ag), tin (Sn), gold (Au), nickel (Ni), lead (Pb), titanium (Ti), or an alloy thereof. The via pad 210 may perform various functions according to the design. For example, the via pad 210 may include a ground pattern, a power pattern, a signal pattern, and the like. Each of these patterns may have a line, plane, or pad shape.

In the printed circuit board 100A according to the first exemplary embodiment in the present disclosure, the first layer 211 of the via pad 210 may be formed by plating such as an additive process (AP), a semi AP (SAP), a modified SAP (MSAP), or tenting (TT). As a result, the first layer 211 may include a seed layer, an electroless plating layer, and an electrolytic plating layer, formed on the basis of the seed layer.

On the other hand, the second layer 212 of the via pad 210 may be formed through tenting (TT) among the above-described plating techniques. Thus, as in the manufacturing process to be described later, after an etching resist R is disposed, the second layer 212 may be formed by removing the seed layer 13 in an area on which the etching resist R is not formed. In this case, the etching resist R may have a narrower width than the first layer 211. Accordingly, the second layer 212 formed based on the etching resist R may eventually be formed to have a narrower width than the first layer 211. As a result, the first layer 211 and the second layer 212 may be formed to have a step portion.

In addition, since the second layer 212 is formed by tenting (TT) as described above, the second layer 212 may have a width varying in a stacking direction or a thickness direction. Specifically, the second layer 211 may have a width decreasing in a direction away from the first layer 211. This is a structure of the second layer 212 manufactured through the tenting (TT) technique. Therefore, when the first layer 211 is formed through a different type of plating technique from the second layer 212, the first layer 211 may be formed in a different shape from the second layer 212. On the other hand, when the first layer 211 is formed through the same type of plating technique as the second layer 212, i.e. tenting (TT), the first layer 211 may also have a width increasing or decreasing in the stacking direction or in the thickness direction.

The fine circuit unit 310 may be formed simultaneously with the formation of the first layer 211 of the via pad 210 described above. Thus, the fine circuit unit 310 and the via pad 210 may be disposed on the same level in the printed circuit board. In addition, since the via pad 210 has a structure in which the second layer 212 is additionally disposed on the first layer 211, the via pad 210 may be thicker than the fine circuit unit 310.

As a material of the fine circuit unit 310, a metal material may be used. Here, the metal material may be copper (Cu), aluminum (Al), silver (Ag), tin (Sn), gold (Au), nickel (Ni), lead (Pb), titanium (Ti), or an alloy thereof. The fine circuit unit 310 may perform various functions according to the design. For example, the fine circuit unit 310 may include a ground pattern, a power pattern, a signal pattern, and the like. Each of these patterns may have a line, plane, or pad shape. Meanwhile, the fine circuit unit 310 may be formed by plating such as an additive process (AP), a semi AP (SAP), a modified SAP (MSAP), or tenting (TT). As a result, the fine circuit unit 310 may include a seed layer, an electroless plating layer, and an electrolytic plating layer, formed on the basis of the seed layer.

The fine circuit unit 310 may have a fine width and pitch, unlike the wiring layers 220, 230, and 240 of the build-up structures 111 and 112 to be described later. Specifically, the L/S ratio of the fine circuit unit 310 may be 5/5 or thereabout, and the fine circuit unit 310 may include a relatively high-density circuit. Here, the high density may mean that the fine circuit unit 310 has a relatively fine pitch and/or a relatively small interval.

As an example of the high-density circuit, the fine circuit unit 310 may have a relatively finer pitch than the plurality of wiring layers 220, 230, and 240, and may have a relatively narrower width than the plurality of wiring layers 220, 230, and 240.

Here, the pitch may refer to a distance from the center of one conductor pattern to the center of another adjacent conductor pattern in each of the wiring layers. In addition, in the present disclosure, the pitch of each of the fine circuit unit 310 and the plurality of wiring layers 220, 230, and 240 may refer to an average pitch value, rather than any one of several pitches. That is, if the fine circuit unit 310 is mentioned as having a relatively finer pitch than the plurality of wiring layers 220, 230, and 240 in the printed circuit board 100A, this means that an average value of respective pitches between patterns in the fine circuit unit 310 may be smaller than that in each of the plurality of wiring layers 220, 230, and 240.

For example, in the printed circuit board 100A, when the average value of pitches between patterns in the fine circuit unit 310 is defined as a first pitch, and the average value of pitches between patterns of at least one of the plurality of wiring layers 220, 230, and 240 is defined as a second pitch, the first pitch may be greater than the second pitch.

The pitch of the fine circuit unit 310 may be 10 μm or less, but is not necessarily limited thereto as long as the fine circuit unit 310 has a relatively smaller pitch value than the wiring layers 220, 230, and 240 using a thinner dry film resist than the wiring layers 220, 230, and 240.

In addition, here, the width may be used in the same sense as the diameter of each of the fine circuit unit 310 and the plurality of wiring layers 220, 230, and 240. For example, if the fine circuit unit 310 is mentioned as having a narrower width than the plurality of wiring layers 220, 230, and 240 in the printed circuit board 100A, this means that an average value of respective patterns, rather than a value of any one pattern, may be relatively compared between the fine circuit unit 310 and the plurality of wiring layers 220, 230, and 240. Consequently, if the fine circuit unit 310 is mentioned as having a narrower width than the plurality of wiring layers 220, 230, and 240, this may mean that an average width value of the respective patterns in the fine circuit unit 310 is smaller than that of each of the plurality of wiring layers 220, 230, and 240.

Meanwhile, in the fine circuit unit 310, L/S may be 5/5 or less. Here, the L/S refers to a line/space ratio, which may mean a width (line) of any one pattern relative to an interval (space) between any one pattern and another adjacent pattern in the fine circuit unit 310. The fine circuit unit 310 in the printed circuit board according to the present disclosure may be implemented as a circuit having finer circuit patterns than general circuit patterns, so that the L/S is 5/5 or less, thereby making it possible to transmit a signal without causing a short circuit or a defect in the thinner and smaller printed circuit board. In addition, the L/S of the fine circuit unit 310 is not necessarily limited to 5/5 or less, and may be arbitrarily changed as long as the pitch value is maintained as 10 μm or less. For example, the L/S ratio of the fine circuit unit 310 may have a value ranging from 4/6 to 6/4.

As a material of the plurality of wiring layers 220, 230, and 240, a metal material may be used. Here, the metal material may be copper (Cu), aluminum (Al), silver (Ag), tin (Sn), gold (Au), nickel (Ni), lead (Pb), titanium (Ti), or an alloy thereof. The plurality of wiring layers 220, 230, and 240 may perform various functions according to the designs. For example, the plurality of wiring layers 220, 230, and 240 may include a ground pattern, a power pattern, a signal pattern, and the like. Each of these patterns may have a line, plane, or pad shape. Meanwhile, the plurality of wiring layers 220, 230, and 240 may be formed by plating such as an additive process (AP), a semi AP (SAP), a modified SAP (MSAP), or tenting (TT). As a result, each of the plurality of wiring layers 220, 230, and 240 may include a seed layer, an electroless plating layer, and an electrolytic plating layer, formed on the basis of the seed layer.

The plurality of wiring layers 220, 230, and 240 may be referred to as second to fourth wiring layers 220 to 240, respectively, and more wiring layers or less wiring layers may be disposed. In addition, the via pad 210 according to the present disclosure may be referred to as a first wiring layer 210 for convenience.

The plurality of via layers 410, 420, and 430 may include a first via layer 410 penetrating through the first insulating layer 110 and electrically connecting the via pad 210 and the second wiring layer 220 to each other, a second via layer 420 penetrating through the second insulating layer 120 and electrically connecting the second wiring layer 220 and the fourth wiring layer 240 to each other, and a third via layer 430 penetrating through the third insulating layer 130 and electrically connecting the via pad 210 and the third wiring layer 230 to each other. Specifically, the first via layer 410 may be in contact with the first layer 211 of the via pad 210 to be electrically connected thereto, and the third via layer 430 may be in contact with the second layer 212 of the via pad 210 to be electrically connected thereto.

As a material of the plurality of via layers 410, 420, and 430, a metal material may be used. Here, the metal material may be copper (Cu), aluminum (Al), silver (Ag), tin (Sn), gold (Au), nickel (Ni), lead (Pb), titanium (Ti), or an alloy thereof. The plurality of via layers 410, 420, and 430 may include a signal via, a ground via, a power via, and the like according to the designs. Vias of the plurality of via layers 410, 420, and 430 may be formed such that each via hole is completely filled with the metal material, or the metal material is formed along a wall surface of each via hole. Meanwhile, the plurality of via layers 410, 420, and 430 may also be formed by plating such as AP, SAP, MSAP, or TT, and may include a seed layer, an electroless plating layer, and an electrolytic plating layer, formed on the basis of the seed layer. Each via of the plurality of via layers 410, 420, and 430 may have a tapered shape in which a width of one surface thereof is greater than that the other surface thereof. Specifically, each via of the first and second via layers 410 and 420 may have a tapered shape in which a width of a lower surface thereof is greater than that of an upper surface thereof, and each via of the third via layer 430 may have a tapered shape in which a width of an upper surface thereof is greater than that of a lower surface thereof.

In addition, although not illustrated, the build-up structures 111 and 112 including the second and third insulating layers 120 and 130 and the plurality of wiring layers 220, 230, and 240 as described above may be optionally disposed. Therefore, optionally, more or fewer insulating layers, wiring layers, and via layers may be disposed than those in the exemplary embodiment illustrated in FIG. 3. When more via layers are disposed, a tapered direction of each via layer may be differentiated in the same way as those of the above-described first to third via layers 410 to 430. For example, based on the via pad 210, a via of a via layer disposed above the via pad 210 in the stacking direction may have a tapered shape in which a width of an upper surface thereof is greater than that of a lower surface thereof, and a via of a via layer disposed below the via pad 210 in the stacking direction may have a tapered shape in which a width of a lower surface thereof is greater than that of an upper surface thereof.

In addition, although not illustrated, a solder resist layer having a plurality of openings exposing at least some of the patterns on the outermost layer, respectively, may be further disposed on each of the build-up structures 111 and 112 described above. In this case, the build-up structures 111 and 112 may be disposed optionally as described above. For example, the solder resist layer may be disposed on each of the build-up structures 111 and 112, but when the build-up structures 111 and 112 are not disposed, the solder resist layer may be disposed on the first insulating layer 110 to have openings each exposing at least a portion of the via pad 210. By using the solder resist, internal components can be protected from physical and chemical damage.

A plurality of electrical connection metals may be further disposed in the plurality of openings. Each of the plurality of electrical connection metals may be electrically connected to the exposed wiring layer or via pad. The plurality of electrical connection metals may physically and/or electrically connect the printed circuit board 100A to the outside. For example, the printed circuit board 100A may be mounted on a main board of an electronic device or a ball grid array (BGA) substrate through the plurality of electrical connection metals. The plurality of electrical connection metals may physically and/or electrically connect the printed circuit board 100A to a component surface-mounted thereon. Each of the plurality of electrical connection metals may be formed of tin (Sn) or an alloy containing tin (Sn), e.g. solder, but is not limited thereto. Each of the plurality of electrical connection metals may be a land, a ball, a pin, or the like.

FIGS. 4 through 11 are cross-sectional views schematically illustrating an example of a process of manufacturing the printed circuit board according to the first exemplary embodiment in the present disclosure.

In FIGS. 4 through 11, the process of manufacturing the printed circuit board built up on one surface of a carrier 10 is described, but the same may also be performed as a double-sided build-up process.

Figure 4:
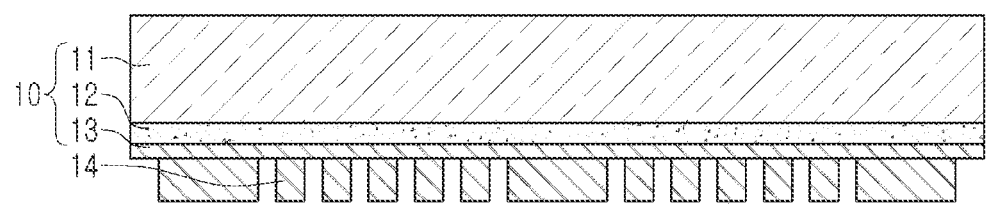
FIGS. 4 through 11 are cross-sectional views schematically illustrating an example of a process of manufacturing the printed circuit board according to the first exemplary embodiment in the present disclosure.
Figure 5:
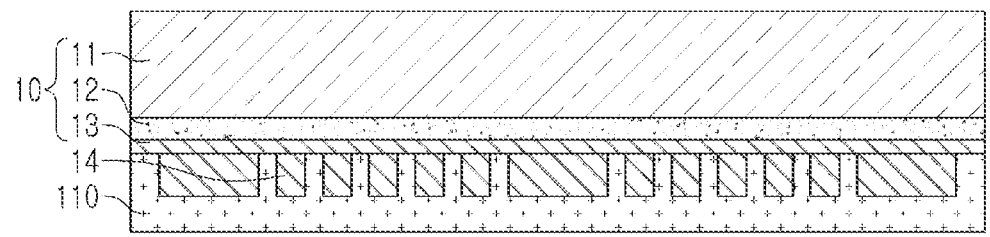
Figure 6:
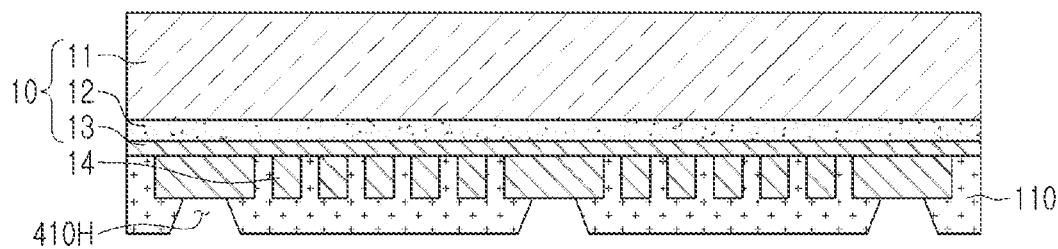
Figure 7:
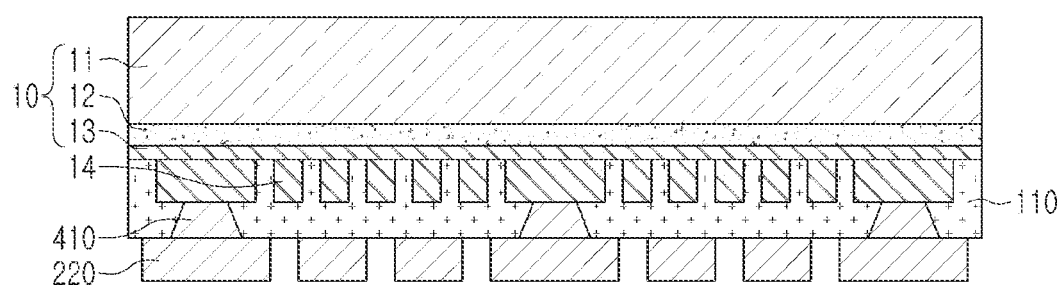
Figure 8:
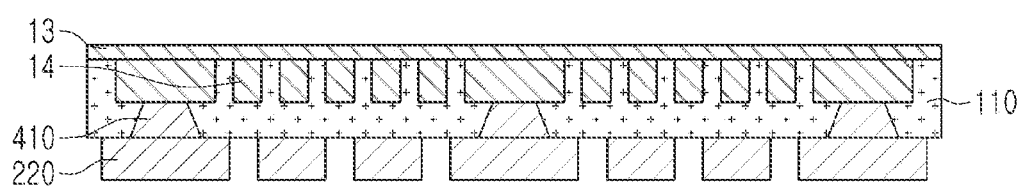

Referring to FIG. 4, first of all, the carrier 10 in which metal foils 12 and 13 are disposed on at least one surface of an insulating layer 11 is prepared. As the carrier 10, a common detach core film (DCF) may be used. Thereafter, a plating layer 14 is formed on the metal foils 12 and 13, and then the plating layer 14 is patterned to form at least a portion of each of the first layer 211 of the via pad 210 and the fine circuit unit 310. Next, the first insulating layer 110 is formed on the patterned plating layer 14 so that the plating layer 14 is embedded therein, the first insulating layer 110 is processed to form a via hole therein by laser drilling or the like, and the first via layer 410 and the second wiring layer 220 are formed by plating. Thereafter, the metal foil of the carrier 10 is separated to remove the insulating layer 11, and the etching resist R is disposed.

Figure 9:
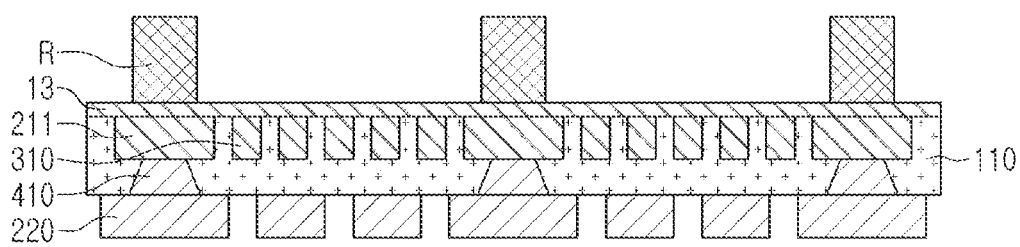

Referring to FIG. 9, the etching resist R may be disposed on the metal foil 13, particularly in an area overlapping with the first layer 211, and may have a narrower width than the first layer 211. In addition, although not illustrated, the etching resist R may also be disposed on the second wiring layer 220.

Figure 10:
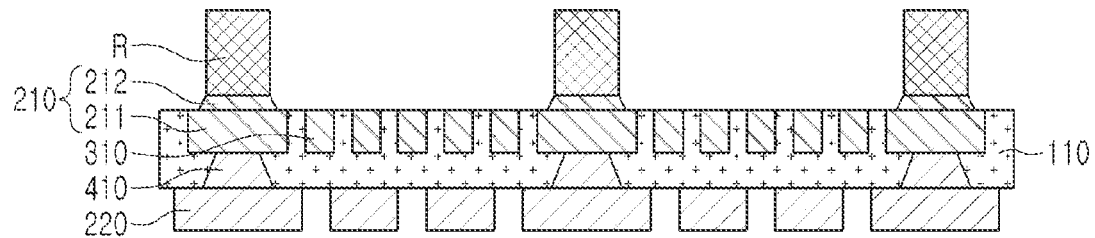

Thereafter, as illustrated in FIG. 10, the metal foil 13 exposed from the etching resist R may be removed through etching. For etching, a common etching technique, such as wet etching or dry etching, may be used without being limited. After the etching is performed as illustrated in FIG. 10, a non-etched portion under the etching resist R may become the second layer 212 of the via pad 210.

In addition, in an area remaining after the area exposed from the etching resist R is partially etched, a portion embedded in the first insulating layer 110 may become the fine circuit unit 310. Thus, the fine circuit unit 310 may be formed simultaneously with the via pad 210.

Meanwhile, since the etching resist R is also disposed on the second wiring layer 220, the second wiring layer 220 may also be prevented from being etched together at the time of forming the second layer 212.

Figure 11:
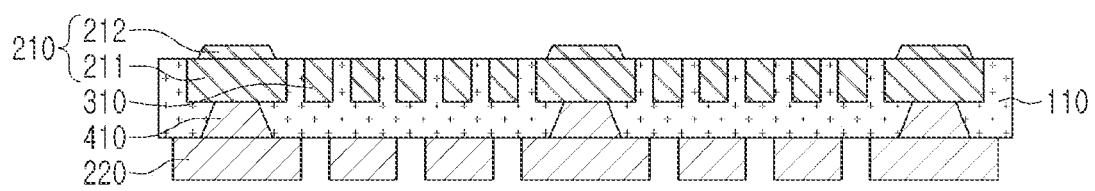

FIG. 11 illustrates a configuration of the via pad 210 including the first layer 211 and the second layer 212. As described above, the second layer 212 formed through etching using the etching resist R may be formed to have a width varying in the thickness direction. For example, the second layer 212 may have a width decreasing in a direction away from the first layer 211.

In addition, since the second layer 212 is formed using the metal foil 13, an interface may be formed between the first and second layers 211 and 212. As a result, a boundary between the first and second layers 211 and 212 of the via pad 210 may be clearly distinguishable. A heterogeneous metal layer for preventing over-etching may be formed on the interface between the first and second layers 211 and 212. When the heterogeneous metal layer is coated on the interface, the first layer 211 or the fine circuit unit 310 can be prevented from being damaged even if an etched amount of the metal foil 13 is excessive.

Figure 12:
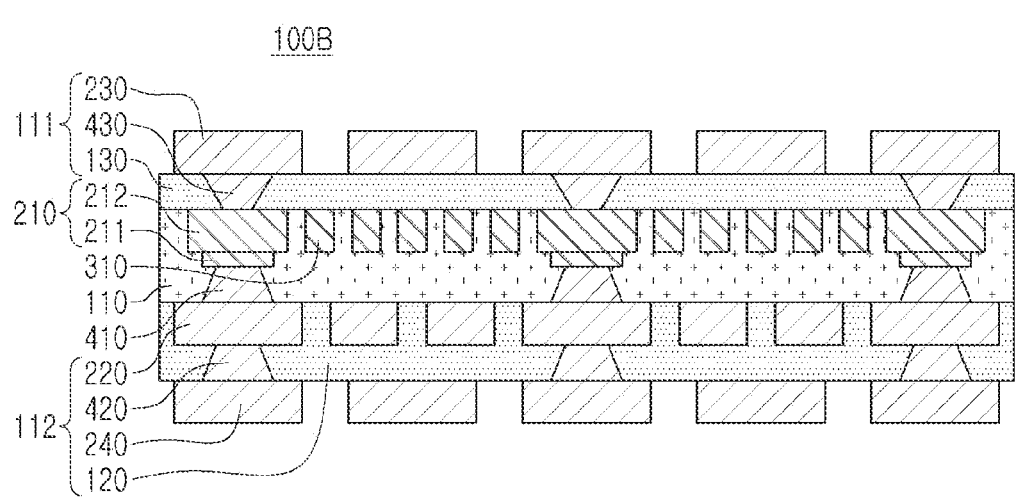
FIG. 12 is a cross-sectional view schematically illustrating a structure of a printed circuit board according to a second exemplary embodiment in the present disclosure.

Thereafter, as in the structure of FIG. 12, the second and third insulating layers 120 and 130 may be built up, and the second and third via layers 420 and 430 and the third and the fourth wiring layers 230 and 240 may be additionally built up by repeatedly performing the above-described processing and plating, thereby completing the printed circuit board 100A according to the first exemplary embodiment of FIG. 3.

The above-described printed circuit board 100A according to the first exemplary embodiment may be manufactured through a series of step portions, and overlapping descriptions are omitted.

FIG. 12 is a cross-sectional view schematically illustrating a structure of a printed circuit board according to a second exemplary embodiment in the present disclosure, and FIGS. 13 through 17 are cross-sectional views schematically illustrating an example of a partial process of manufacturing the printed circuit board according to the second exemplary embodiment in the present disclosure.

Referring to FIGS. 12 through 17, as compared with the printed circuit board 100A according to the first exemplary embodiment, the printed circuit board 100B according to the second exemplary embodiment is different in that the first layer 211 and the second layer 212 of the via pad 210 may be vertically inverted. In this case, the second layer 212 may have a relatively constant width as compared with that in the printed circuit board 100A according to the first exemplary embodiment.

The printed circuit board 100B according to the second exemplary embodiment will be described, focusing on a difference from the printed circuit board 100A according to the first exemplary embodiment, and the other overlapping description will be omitted because the description of the first exemplary embodiment may be identically applied to the second exemplary embodiment.

Specifically, the printed circuit board 100B according to the second exemplary embodiment may be different, in the shape of the via pad 210, from the printed circuit board 100A according to the first exemplary embodiment.

Figure 13:
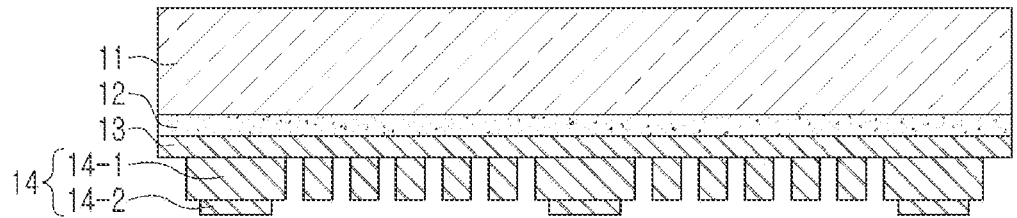
FIGS. 13 through 17 are cross-sectional views schematically illustrating an example of a partial process of manufacturing the printed circuit board according to the second exemplary embodiment in the present disclosure.

Referring to FIG. 13, in the printed circuit board 100B according to the second exemplary embodiment, the plating layer 14 on the metal foil 13 of the carrier 10 may include a plurality of plating layers, i.e. first and second plating layers 14-1 and 14-2. In this case, each of the first and second plating layers 14-1 and 14-2 may be formed by plating through exposure/development, using a photosensitive resist. As a result, each of the first and second plating layers 14-1 and 14-2 may include a seed layer, an electroless plating layer, and an electrolytic plating layer, formed on the basis of the seed layer. In this case, the second plating layer 14-2 may be disposed on the first plating layer 14-1 by plating, and the second plating layer 14-2 may have a narrower width than the first plating layer 14-1. Consequently, the second plating layer 14-2 and the first plating layer 14-1 may be formed to have a step portion.

Figure 14:
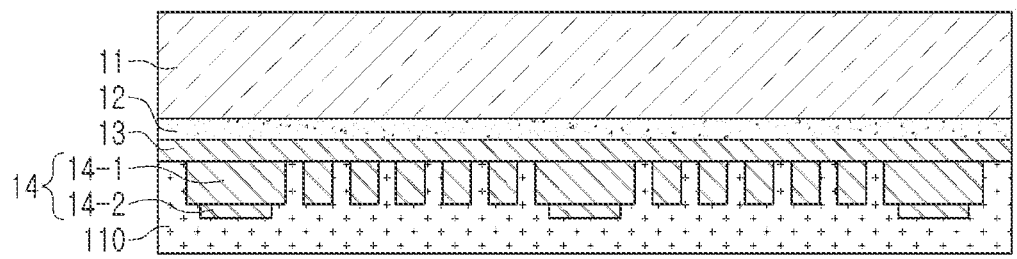
Figure 15:
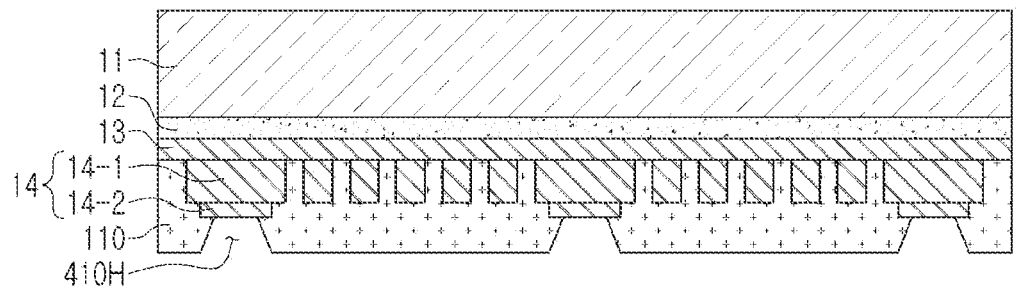
Figure 16:
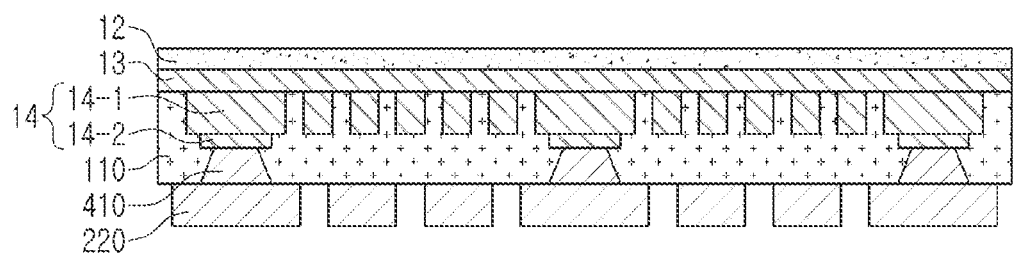

FIGS. 14 through 16 illustrate that the first insulating layer 110 is disposed, the first via layer 410 and the second wiring layer 220 are disposed through laser processing and plating, and the metal foil 12 is separated, as in the process of manufacturing the printed circuit board 100A according to the first exemplary embodiment.

Figure 17:
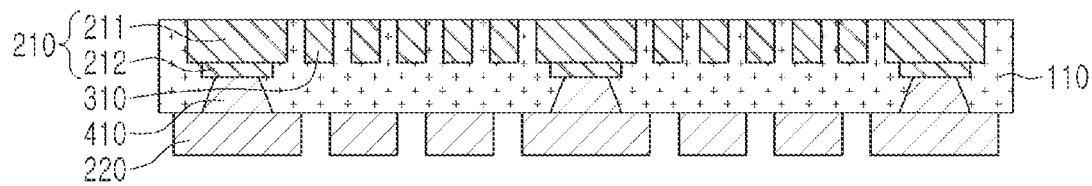

Referring to FIG. 17, the metal foil 13 may be removed through etching. By doing this, the fine circuit unit 310 and the via pad 210 may be disposed. In the printed circuit board 100B according to the second exemplary embodiment, as illustrated in FIG. 17, the second layer 212 may be disposed under the first layer 211. In the printed circuit board 100B according to the second exemplary embodiment, as illustrated in FIG. 17, the first layer 211 may have a greater width than the second layer 212.

The above-described printed circuit board 100B according to the second exemplary embodiment may be manufactured through a series of step portions, and overlapping description is omitted. In addition, for the overlapping description about the manufacturing process and the structure between the first exemplary embodiment and the second exemplary embodiment, the above description of the printed circuit board 100A according to the first exemplary embodiment may be identically applied to the printed circuit board 100B according to the second exemplary embodiment.

Figure 18:
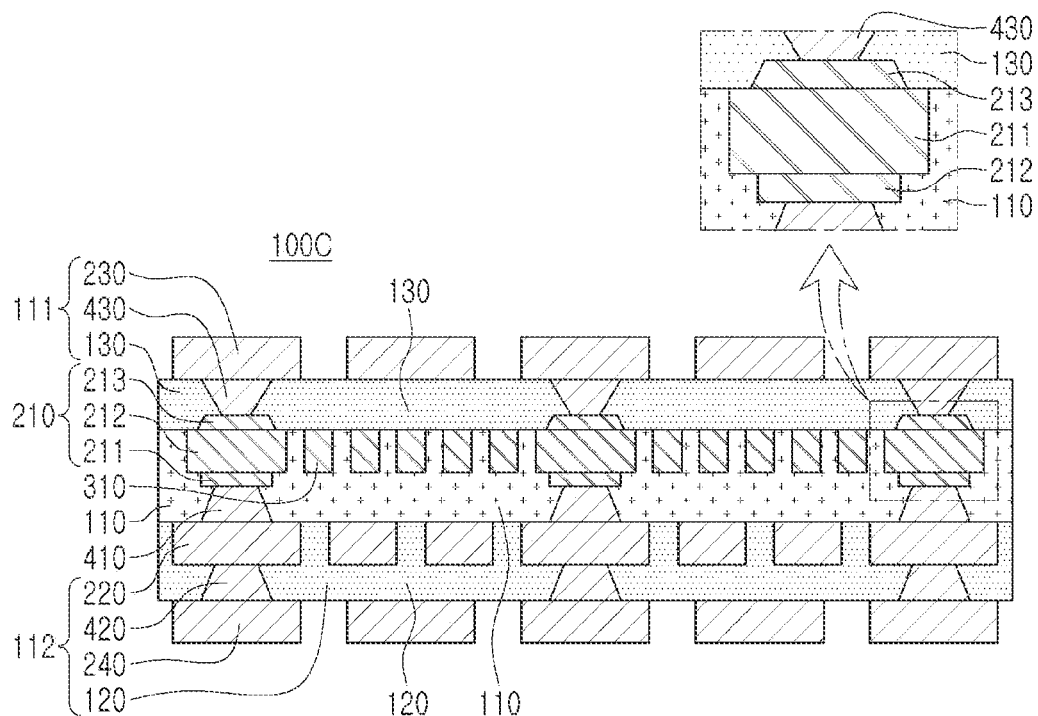
FIG. 18 is a cross-sectional view schematically illustrating a structure of a printed circuit board according to a third exemplary embodiment in the present disclosure.
Figure 19:
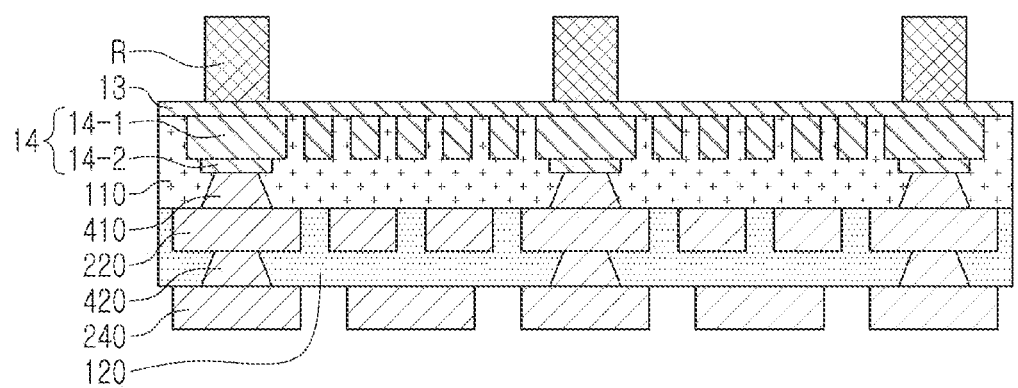
FIGS. 19 through 21 are cross-sectional views schematically illustrating an example of a partial process of manufacturing the printed circuit board according to the third exemplary embodiment in the present disclosure.
Figure 20:
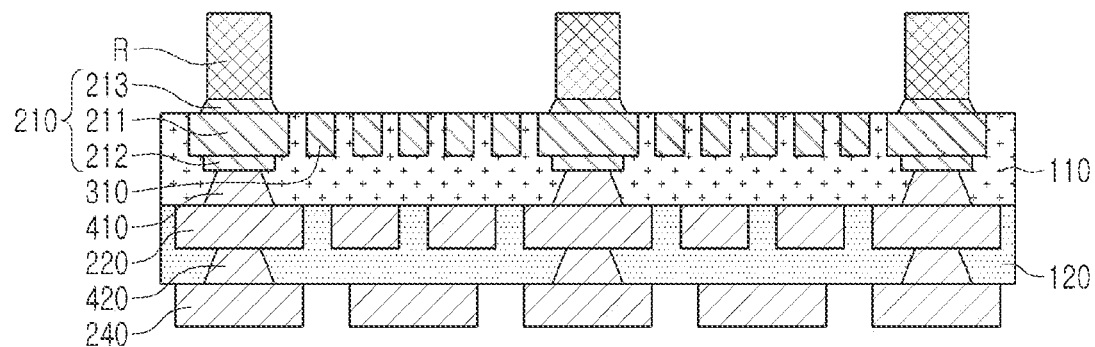
Figure 21:
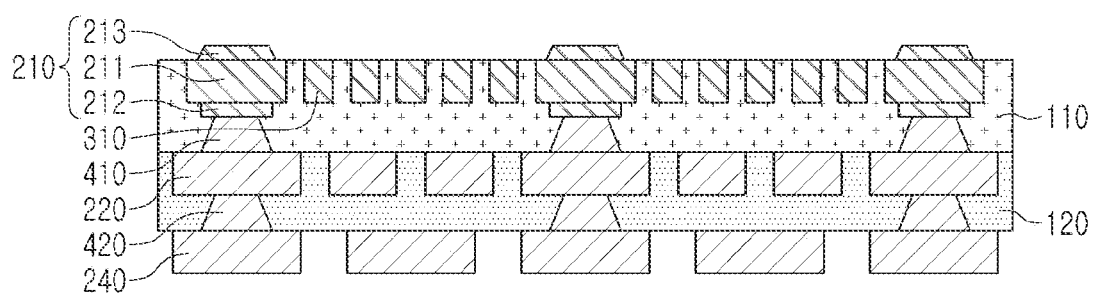

FIG. 18 is a cross-sectional view schematically illustrating a structure of a printed circuit board according to a third exemplary embodiment in the present disclosure, and FIGS. 19 through 21 are cross-sectional views schematically illustrating an example of a partial process of manufacturing the printed circuit board according to the third exemplary embodiment in the present disclosure.

Referring to FIGS. 18 through 21, as compared with the printed circuit board 100B according to the second exemplary embodiment, the printed circuit board 100C according to the third exemplary embodiment is different in that the via pad 210 may include a third layer 213 disposed on the other surface of the first layer 211. In this case, the third layer 213 may have a width decreasing in a direction away from the first layer 211.

The printed circuit board 100C according to the third exemplary embodiment will be described focusing on a difference from the printed circuit board 100B according to the second exemplary embodiment, and the other overlapping description will be omitted because the description of the second exemplary embodiment may be identically applied to the third exemplary embodiment.

Specifically, the printed circuit board 100C according to the third exemplary embodiment may be different, in the shape of the via pad 210, from the printed circuit board 100B according to the second exemplary embodiment, and the difference will be described in detail based on the manufacturing process.

The step portions of FIGS. 13 through 16, which are parts of the process of manufacturing the printed circuit board 100B according to the second exemplary embodiment as described above, may be identically applied to those in the process of manufacturing the printed circuit board 100C according to the third exemplary embodiment.

Thereafter, as illustrated in FIG. 19, the etching resist R may be disposed on the metal foil 13 in an area overlapping with the first plating layer 14-1 or the second plating layer 14-2. Then, the metal foil 13 exposed from the etching resist R may be removed through etching, as in the process of manufacturing the printed circuit board 100A according to the first exemplary embodiment. For etching, a tenting technique may be used.

FIG. 20 illustrates a structure in which the metal foil 13 exposed from the etching resist R is partially removed, and FIG. 21 illustrates a structure in which the etching resist R is peeled off. In the printed circuit board 100C according to the third exemplary embodiment, like the printed circuit board 100A according to the first exemplary embodiment, the second layer 212 may be formed using the metal foil 13, and thus, an interface may be formed between the first and second layers 211 and 212. As a result, a boundary between the first and second layers 211 and 212 of the via pad 210 may be clearly distinguished. A heterogeneous metal layer for preventing over-etching may be formed on the interface between the first and second layers 211 and 212. When the heterogeneous metal layer is coated on the interface, the first layer 211 or the fine circuit unit 310 can be prevented from being damaged even if an etched amount of the metal foil 13 is excessive.

As illustrated in FIG. 21, a non-etched area that is covered by the etching resist R may become the third layer 213 of the via pad 210. As in the printed circuit board 100A according to the first exemplary embodiment, the third layer 213 may have a width decreasing in a direction away from the first layer 211. Consequently, the second and third layers 212 and 213 may be disposed on a first surface and a second surface of the first layer 211, respectively, and the first layer 211 may be formed to be stepped from the second and third layers 212 and 213. Thus, the via pad 210 may have stepped structures protruding upwardly and downwardly, respectively, and the second and third layers 212 and 213 may be different in shape.

For example, the third layer 213 may have a width decreasing in the stacking direction away from the first layer 211, whereas the second layer 212 may have a relatively constant width in the stacking direction as compared with the third layer 213.

By forming the via pad 210 to be thicker than the fine circuit unit 310 disposed on the same layer as described above, the fine circuit unit 310 can be maintained to have a small thickness and width, while it is possible to prevent occurrence of defects in the via pad 210, such as a burst or a void, at the time of processing the first and third via layers 410 and 430.

As set forth above, according to the exemplary embodiment in the present disclosure, it is possible to provide a printed circuit board in which a fine circuit can be implemented.

In addition, it is possible to provide a printed circuit board in which no defect occurs in a via pad or an external solder connection pad at the time of processing a via or bonding a solder.

While exemplary embodiments have been shown and described above, it will be apparent to those skilled in the art that modifications and variations could be made without departing from the scope of the present invention as defined by the appended claims.

What is claimed is:

1. A printed circuit board comprising:
   a first insulating layer;
   a second insulating layer disposed on the first insulating layer;
   a via pad including a first layer embedded in the first insulating layer and a second layer disposed on the first layer and embedded in the second insulating layer, the second layer directly contacting the first layer; and
   a first via layer disposed on one side of the via pad, connected to the first layer and penetrating through at least a portion of the first insulating layer, and a second via layer disposed on an opposing side of the via pad, connected to the second layer and penetrating through at least a portion of the second insulating layer,
   wherein the second layer has a width decreasing in a direction away from the first layer in a stacking direction of the first and second layers,
   each of the first and second layers of the via pad includes a metal material,
   the second via layer is in contact with the second layer and has a tapered side surface, and each of the first and second insulating layers is a single layer.

2. The printed circuit board of claim 1, wherein a width of the first layer is greater than a width of the second layer.

3. The printed circuit board of claim 2, wherein the second layer protrudes from a first surface of the first insulating layer.

4. The printed circuit board of claim 3, wherein an interface is formed between the first layer and the second layer.

5. The printed circuit board of claim 4, wherein a heterogeneous metal layer is formed on the interface, and
the first via layer has a width increasing in a direction away from the via pad in the stacking direction.

6. The printed circuit board of claim 5, further comprising a fine circuit unit embedded in the first insulating layer,
wherein the fine circuit unit is disposed on the same level as the first layer of the via pad, the fine circuit unit overlapping the first layer in a width direction perpendicular to the stacking direction.

7. The printed circuit board of claim 6, further comprising build-up structures disposed on the first surface and a second surface of the first insulating layer, and including a plurality of insulating layers, a plurality of wiring layers, and a plurality of via layers,
wherein the build-up structure disposed on the first surface of the first insulating layer includes the second insulating layer and the second via layer.

8. The printed circuit board of claim 7, wherein when an average pitch of the fine circuit unit is defined as a first pitch and an average pitch of at least one of the plurality of wiring layers is defined as a second pitch, the first pitch is narrower than the second pitch.

9. A printed circuit board comprising:
a first insulating layer;
a second insulating layer disposed on the first insulating layer;
a via pad and a fine circuit unit at least partially embedded in the first insulating layer;
a first via layer penetrating through at least a portion of the first insulating layer and disposed on one side of the via pad in a stacking direction; and
a second via layer penetrating through at least a portion of the second insulating layer and disposed on an opposing side of the via pad in a stacking direction,
wherein the via pad has a step portion,
the via pad includes a first layer and a second layer, the second layer being disposed on and directly contacting a first surface of the first layer,
each of the first and second layers of the via pad includes a metal material, the first and second layers of the via pad are distinct layers having a physical interface therebetween, and
each of the first and second insulating layers is a single layer.

10. The printed circuit board of claim 9, wherein the via pad and the fine circuit unit are disposed on the same level and overlap each other in a width direction perpendicular to the stacking direction.

11. The printed circuit board of claim 9, wherein the via pad has a greater thickness than the fine circuit unit.

12. The printed circuit board of claim 9, wherein the first layer has a greater width than the second layer.

13. The printed circuit board of claim 12, wherein the first via layer is in contact with the second layer to be electrically connected thereto.

14. The printed circuit board of claim 13, wherein the via pad further includes a third layer disposed on a second surface of the first layer opposite to the first surface of the first layer,
the first and second layers are embedded in the first insulating layer, and
the third layer protrudes from a first surface of the first insulating layer and is embedded in the second insulating layer.

15. The printed circuit board of claim 14, wherein the third layer has a width decreasing in a direction away from the first layer in a stacking direction of the first and second layers.

16. The printed circuit board of claim 15, further comprising build-up structures disposed on the first surface and a second surface of the first insulating layer, and including a plurality of insulating layers, a plurality of wiring layers, and a plurality of via layers,
wherein the build-up structure disposed on the second surface of the first insulating layer includes the second insulating layer and the second via layer.

17. A printed circuit board comprising:
a first insulating layer having a first surface and a second surface opposing each other in a stacking direction;
a second insulating layer disposed on the first surface of the first insulating layer;
a via pad at least partially embedded in the first insulating layer;
a fine circuit unit embedded in the first insulating layer, exposed to the first surface of the first insulating layer, and disposed adjacent to a side of the via pad in a width direction perpendicular to the stacking direction;
a first via layer embedded in the first insulating layer, exposed to the second surface of the first insulating layer, and connected to one side of the via pad; and
a second via layer embedded in the second insulating layer and connected to an opposing side of the via pad,
wherein the fine circuit unit is not in direct contact with any conductive element, and each of the first and second insulating layers is a single layer.

18. The printed circuit board of claim 17, wherein the via pad includes a first layer embedded in the first insulating layer and a second layer disposed on the first layer and embedded in the second insulating layer, and the second layer protruding from the first surface of the first insulating layer.

19. The printed circuit board of claim 18, wherein the first layer of the via pad has a reduced-width portion that is connected to the first via layer, and
a thickness of the via pad is greater than a thickness of the fine circuit unit.

20. The printed circuit board of claim 17, further comprising build-up structures disposed on the first surface and the second surface of the first insulating layer, and including a plurality of insulating layers, a plurality of wiring layers, and a plurality of via layers,
wherein the build-up structure disposed on the first surface of the first insulating layer includes the second insulating layer and the second via layer.

* * * * *